US011659757B2

(12) United States Patent
Sun et al.

(10) Patent No.: US 11,659,757 B2
(45) Date of Patent: May 23, 2023

(54) TOUCH DISPLAY SCREEN AND DISPLAY APPARATUS

(71) Applicant: BOE Technology Group Co., Ltd., Beijing (CN)

(72) Inventors: Xuefei Sun, Beijing (CN); Jaegeon You, Beijing (CN); Xinxing Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 2 days.

(21) Appl. No.: 17/483,557

(22) Filed: Sep. 23, 2021

(65) Prior Publication Data

US 2022/0254836 A1 Aug. 11, 2022

(30) Foreign Application Priority Data

Feb. 7, 2021 (CN) .......................... 202110177347.3

(51) Int. Cl.
*G06F 3/041* (2006.01)
(52) U.S. Cl.
CPC ........... *H10K 59/40* (2023.02); *G06F 3/0412* (2013.01); *H10K 50/84* (2023.02)

(58) Field of Classification Search
None
See application file for complete search history.

(56) References Cited

U.S. PATENT DOCUMENTS

2021/0193756 A1* 6/2021 Oh ...................... H01L 27/3276

* cited by examiner

*Primary Examiner* — Brian M Butcher
(74) *Attorney, Agent, or Firm* — IPRO, PLLC

(57) ABSTRACT

The touch display screen includes a display panel, a touch electrode structure on a light-emitting side of the display panel and a bezel cover layer. The touch display screen includes a display area and a bezel area, and the bezel area has a protrusion sub-area toward the display area. The bezel cover layer is located in the bezel area. The touch electrode structure includes a plurality of touch electrodes and a plurality of leads. The plurality of touch electrodes are located in the display area, and the plurality of leads are arranged in the bezel area along an edge of the display area. The portion of each of the plurality of leads adjacent to the protrusion sub-area is a preset lead portion. An orthographic projection of the bezel cover layer on the display panel covers an orthographic projection of at least one the preset lead portion on the display panel.

14 Claims, 10 Drawing Sheets

TOUCH DISPLAY SCREEN AND DISPLAY APPARATUS

CROSS REFERENCE TO RELATED APPLICATIONS

This disclosure is based on and claims priority under 35 U.S.C. 119 to Chinese Patent Application No. 202110177347.3, filed on Feb. 7, 2021, in the China National Intellectual Property Administration. The entire disclosure of the above application is incorporated herein by reference.

FIELD

The disclosure relates to the field of display technology, in particular to a touch display screen and a display apparatus.

BACKGROUND

With rapid development of the display technology, touch screen panels are widely used in people's lives. At present, the touch screen panel includes an add on mode touch panel, an on cell touch panel and an in cell touch panel for different structures. The on cell touch panel is widely used in an organic light emitting diode (OLED) touch product, which facilitates the product thinning. Due to limit of product requirements of flexible folding, a narrow bezel and the like, the OLED touch product usually adopts a flexible multi-layer on cell (FMLOC) process to design a touch structure. The FMLOC process refers to that a metal mesh electrode layer is fabricated on an encapsulation layer of a display panel for touch control. The add on mode touch panel is not needed for this process. By means of the process, a screen thickness can be reduced, so that folding is facilitated; and there is no attachment tolerance, and a bezel width can be reduced.

SUMMARY

Embodiments of the disclosure provide a touch display screen and a display apparatus.

In one aspect, embodiments of the disclosure provide a touch display screen. The touch display screen includes a display panel, a touch electrode structure on a light-emitting side of the display panel and a bezel cover layer. The touch display screen includes a display area and a bezel area, and the bezel area has a protrusion sub-area toward the display area. The bezel cover layer is located in the bezel area. The touch electrode structure includes a plurality of touch electrodes and a plurality of leads. The plurality of touch electrodes are located in the display area, and the plurality of leads are arranged in the bezel area along an edge of the display area. The portion of each of the plurality of leads adjacent to the protrusion sub-area is a preset lead portion. An orthographic projection of the bezel cover layer on the display panel covers an orthographic projection of at least one of the preset lead portions on the display panel.

In another aspect, embodiments of the disclosure provide a display apparatus, including a circuit board a touch display screen. The touch display screen includes a display panel, a touch electrode structure on a light-emitting side of the display panel and a bezel cover layer. The touch display screen includes a display area and a bezel area, and the bezel area has a protrusion sub-area toward the display area. The bezel cover layer is located in the bezel area. The touch electrode structure includes a plurality of touch electrodes and a plurality of leads. The plurality of touch electrodes are located in the display area, and the plurality of leads are arranged in the bezel area along an edge of the display area. The portion of each of the plurality of leads adjacent to the protrusion sub-area is a preset lead portion. An orthographic projection of the bezel cover layer on the display panel covers an orthographic projection of at least one of the preset lead portions on the display panel. The circuit board is configured to drive the touch display screen to work.

DETAILED DESCRIPTION OF THE EMBODIMENTS

Figure 1:
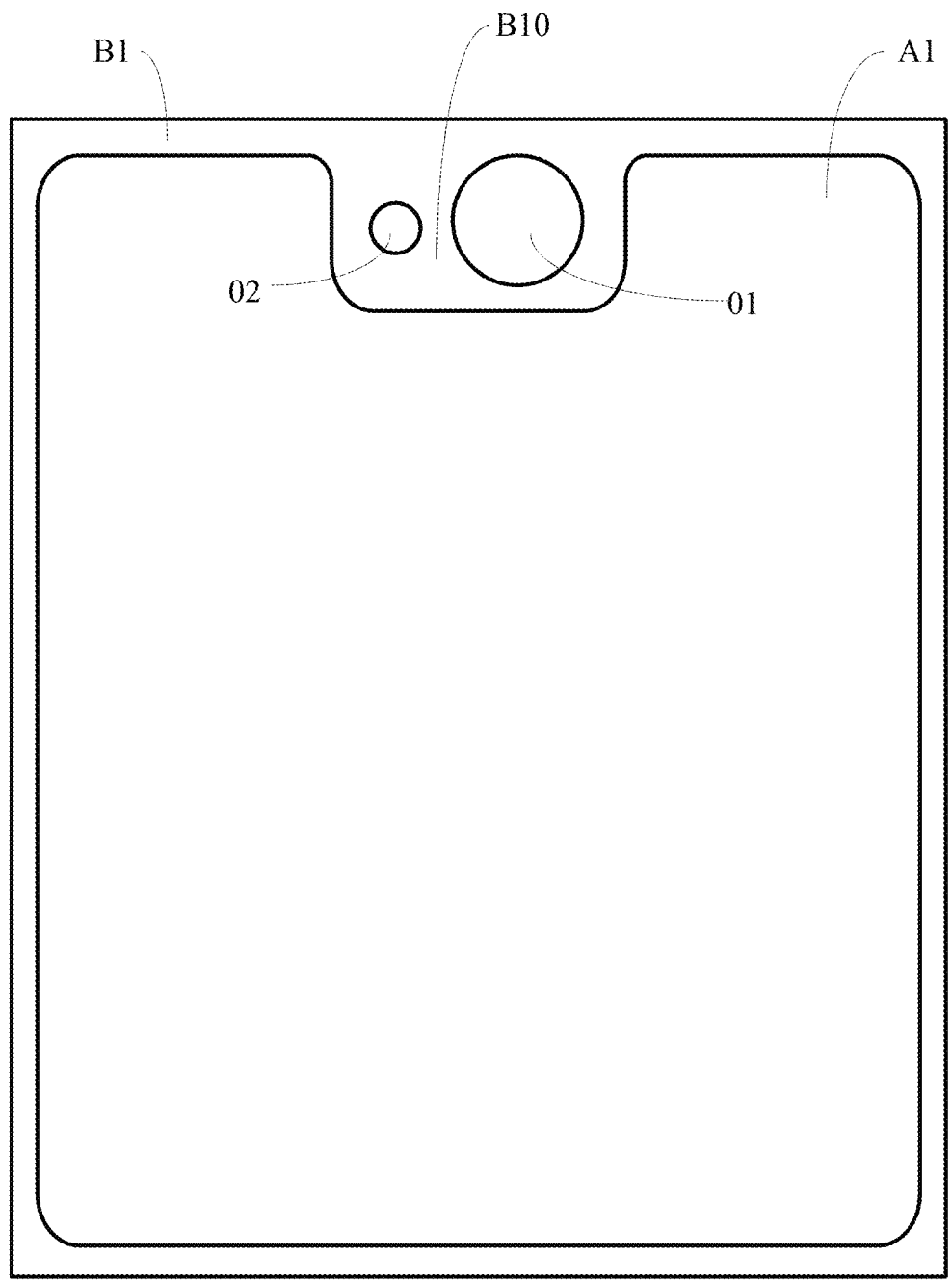
FIG. 1 shows a schematic structural diagram of a touch display screen.

In order to make objectives, features and advantages of the disclosure clearer and more understandable, the disclosure will be further described in combination with accompanying drawings and embodiments. However, exemplary implementations can be implemented in various modes instead of being constructed as being limited to the implementations described herein. Rather, these provided implementations are used for illustration, and the concept of the exemplary implementations is comprehensively conveyed those skilled in the art. Same reference numbers in the drawings represent same or similar structures, and thus repeated descriptions will be omitted. Words for expressing positions and directions described herein make description by taking the drawings for example and can be changed as required, and the changes fall in the protection scope of the disclosure. The drawings of the disclosure are only intended to illustrate a relative position relation rather than a true scale.

It needs to be noted that the following description sets forth specific details so as to fully understand the disclosure. The disclosure can be implemented in various other modes different from the modes described herein, and those skilled in the art can make similar popularization without departing from the intension of the disclosure. Therefore, the disclosure is not limited by the specific implementations disclosed below. The subsequent description in the description is preferred implementations for implementing the disclosure, but is only intended to explain a general principle of the disclosure instead of limiting the scope of the disclosure. The protection scope of the disclosure is defined by the appended claims.

A full screen, compared with a common display screen, can greatly improve a visual effect of a viewer with its larger screen-to-body ratio and an ultra-narrow bezel, thereby being of wide interest. Currently, in a display apparatus like a mobile phone using the full screen, in order to realize the functions of taking a selfie, making a video call and performing fingerprint recognition, a front camera, a telephone receiver, a fingerprint recognition region or real keys, etc. are usually arranged in the front of the display apparatus.

In FIG. 1, an OLED touch display screen for full screen display, generally includes a display area A1 and a bezel area B1. The bezel area B1 has a protrusion sub-area B10 towards to the display area A1 to allow the display area to have a notch. A camera 01, a telephone receiver 02 and other devices are arranged in the protrusion sub-area B10. A touch structure is located in the display area. However, due to high reflectivity of a metal layer in the touch structure, an anti-reflection polarizer of the OLED touch display screen cannot meet a full-view requirement. Especially, an anti-reflection effect in an oblique azimuth angle direction is modest, Mura often occurs at an edge of the Notch sub-area B10 due to the metal layer in the touch structure at certain viewing angles, and consequently, a display effect is affected.

At least for the above, embodiments of the disclosure provide a touch display screen and a display apparatus, which are described below in combination with the drawings.

Figure 2:
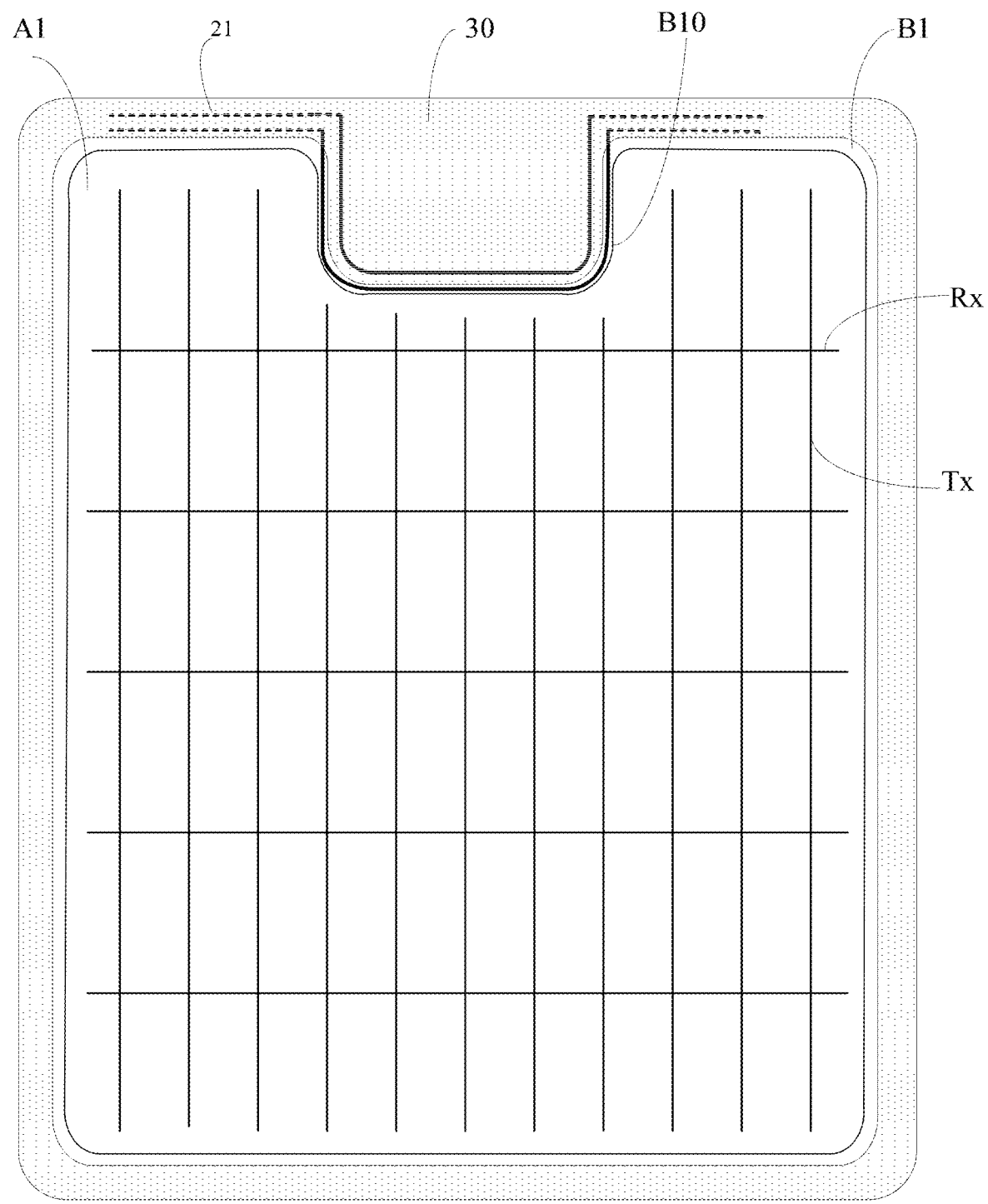
FIG. 2 shows a schematic structural diagram of a touch display screen according to embodiments of the disclosure.
Figure 3:
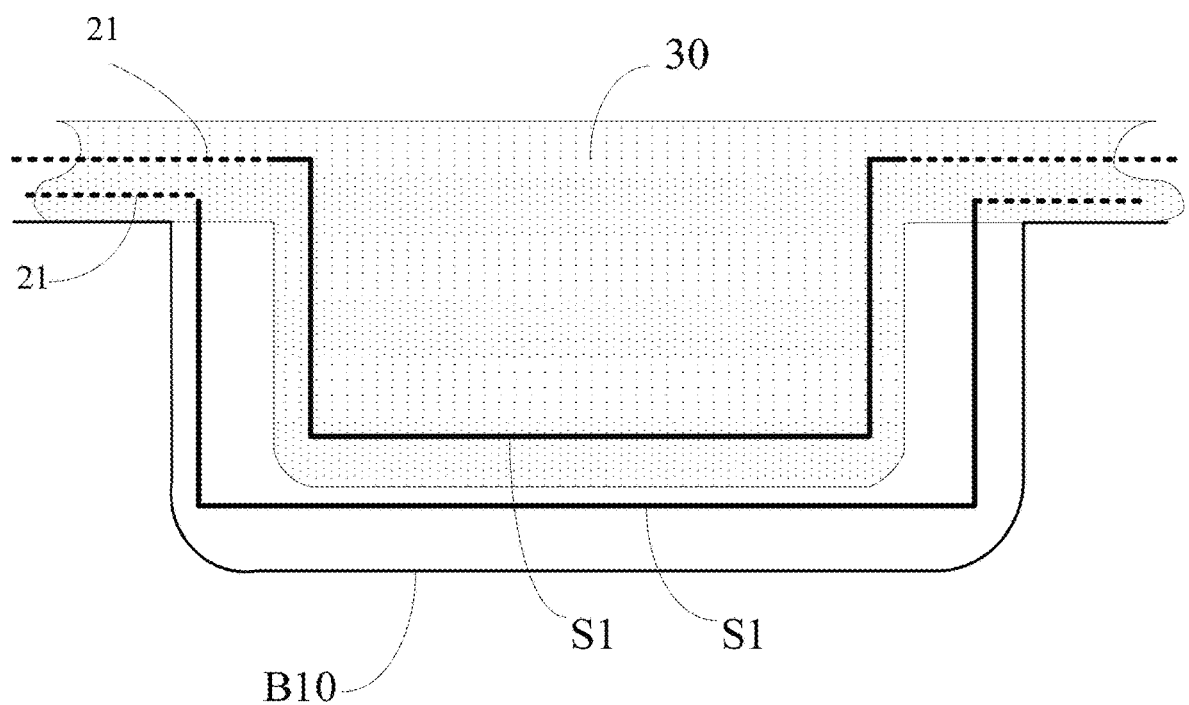
FIG. 3 shows an example first partial structure of a touch display screen according to embodiments of the disclosure.

As shown in FIG. 2 and FIG. 3, FIG. 2 is a schematic structural diagram of a touch display screen according to embodiments of the disclosure, and FIG. 3 is a schematic diagram of a partial structure of a touch display screen according to embodiments of the disclosure. A touch display panel according to embodiments of the disclosure includes a display panel (not shown in FIG. 2 and FIG. 3), a touch electrode structure formed on a light-emitting side of the display panel and a bezel cover layer 30 disposed on a side of the touch electrode structure facing away from the display panel. The touch display screen includes a display area A1 and a bezel area B1, and the bezel area B1 has a protrusion sub-area B10 toward the display area A1, the protrusion sub-area B10 making the display area have a notch. The bezel cover layer 30 is located in the bezel area B1. The touch electrode structure includes a plurality of touch electrodes (Tx and Rx) and a plurality of leads 21. The plurality of touch electrodes (Tx and Rx) are located in the display area A1, and the plurality of leads 21 are in the bezel area B1 along the edge of the display area A1. The portions, of the leads 21, adjacent to the protrusion sub-area B10 are referred to as preset lead portions S1. An orthographic projection of the bezel cover layer 30 on the display panel covers an orthographic projection of at least one of the preset lead portions S1 on the display panel.

Taking two leads 21 in FIG. 3 for example, the orthographic projection of the bezel cover layer 30 on the display panel covers the orthographic projection of the preset lead portion S1 closer to the upper side of the screen on the display panel, but does not cover the orthographic projection of the preset lead portion S1 further to the upper side of the screen on the display panel.

According to the touch display screen provided by the embodiments of the disclosure, the orthographic projection of the bezel cover layer 30 on the display panel covers an orthographic projection of at least one of the preset lead portions S1 on the display panel. That is, at least one of the preset lead portions is covered with the bezel cover layer. As such, a reflection area of the leads is reduced, and the phenomenon of Mura at an edge of the protrusion sub-area is relieved.

In some embodiments, the preset lead portions of the leads can be arranged below without changing an area size of the bezel cover layer, so that an appearance of a touch display screen is not affected.

Figure 4:
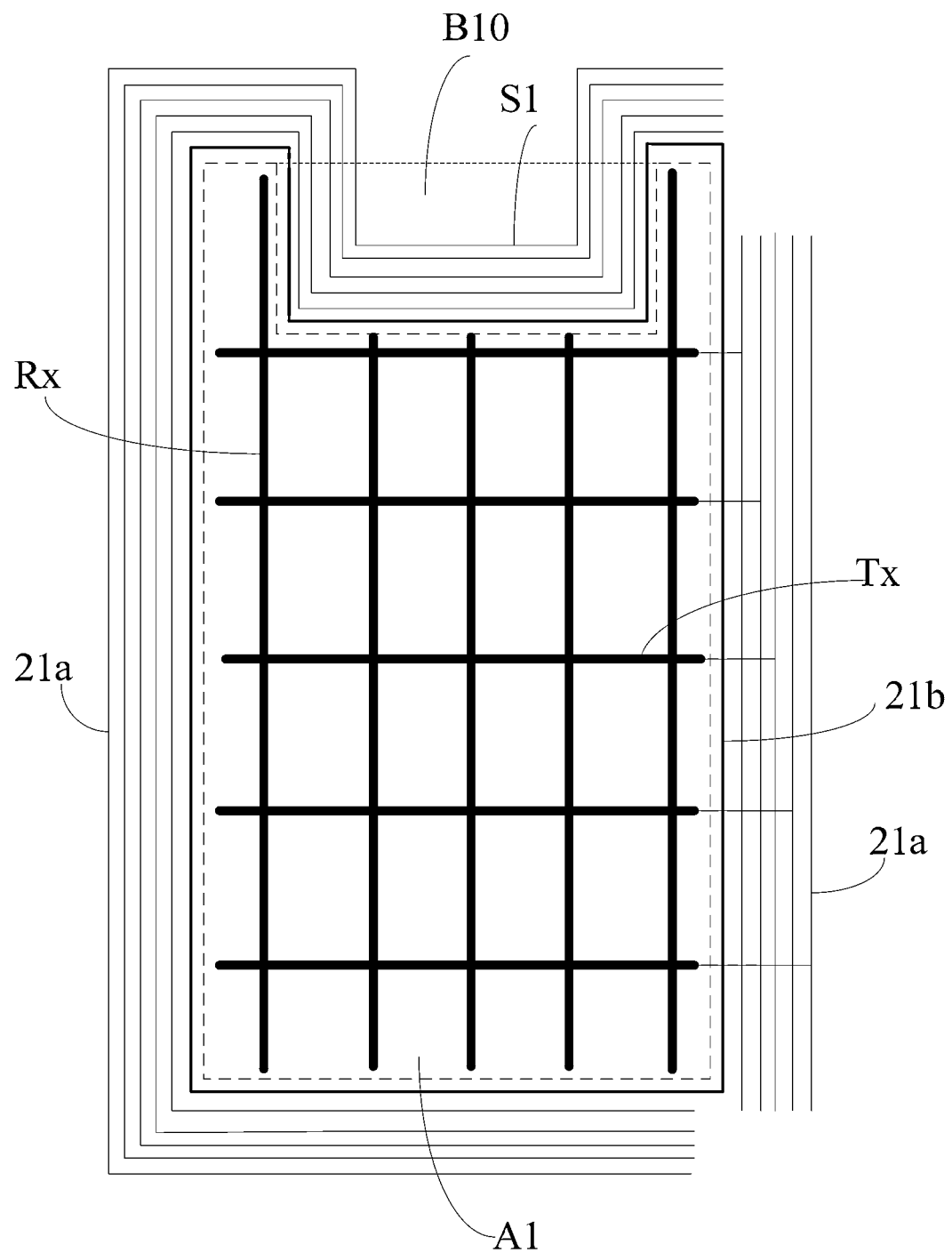
FIG. 4 shows a schematic structural diagram of a touch structure in a touch display screen according to embodiments of the disclosure.

In some embodiments, as shown in FIG. 4, the plurality of touch electrodes include a plurality of touch driving electrodes Tx and a plurality of touch inductive electrodes Rx intersecting with the plurality of touch driving electrodes Tx. In some embodiments, the plurality of touch driving electrodes Tx extend in a row direction and are arranged in a column direction, and the plurality of touch inductive electrodes Rx extend in a column direction and are arranged in a row direction. Alternatively, the plurality of touch driving electrodes Tx extend in a column direction and are arranged in a row direction, and the plurality of touch inductive electrodes Rx extend in a row direction and are arranged in a column direction. The specific arrangement is not limited herein. The plurality of leads include a plurality of touch leads 21a correspondingly connected with the plurality of touch electrodes and a ground lead 21b, wherein the touch leads 21a are configured to provide a driving signal for the corresponding touch electrodes or receive an inductive signal on the corresponding touch electrodes, and the ground lead 21b is configured to be anti-static.

In some embodiments, the protrusion sub-area B10 may be located at a top of the touch display screen, that is, the protrusion sub-area B10 is located at a top side of the display area A1. Alternatively, the protrusion sub-area may be located at other positions of the touch display screen, and a position of the protrusion sub-area is not limited herein.

Exemplarily, as shown in FIG. 4, taking the sub-area B10 located at the top side of the display area A1, the plurality of touch driving electrodes Tx extending in the row direction and arranged in the column direction, and the plurality of touch inductive electrodes Rx generally extending in the column direction and arranged in the row direction for example, the touch leads 21a connected with the touch driving electrodes Tx are arranged along a right edge of the display area A1, the touch leads 21a connected with the touch inductive electrodes Rx are arranged along an upper edge, a left edge and a lower edge of the display area, and the ground lead 21b is arranged around the edge of the display area A1. As the leads are made of a metal material, in the related art, at the edge of the protrusion sub-area B10, the phenomenon of Mura often occurs due to reflection of the metal leads.

For the sake of convenient description, in the disclosure, the portions of the leads adjacent to the protrusion sub-area B10 are defined as the preset lead portions. That is, the portions of the leads causing the phenomenon of Mura at the edge of the protrusion sub-area are the preset lead portions. For example, in FIG. 4, the ground lead 21b has the portion adjacent to the protrusion sub-area B10, the touch leads 21a connected with the touch inductive electrodes Rx have the portions adjacent to the protrusion sub-area B10, so that in the disclosure, the ground lead 21b and at least part of the touch leads 21a have the preset lead portions S1 adjacent to the protrusion sub-area B10. In FIG. 4, for example, the plurality of preset lead portions S1 include: a preset lead portion of the ground lead 21b and the preset lead portions of the touch leads 21a connected with the touch inductive electrodes Rx.

It can be understood that not all the leads have the preset lead portions, and only the leads adjacent to the protrusion sub-area have the preset lead portions.

In the disclosure, the preset lead portions in the leads are set below the bezel cover layer, without increasing an area of the bezel cover layer. That is, at least one of the preset lead portions is covered with the bezel cover layer. Thus a reflection area at the edge of the protrusion sub-area is reduced, and then the phenomenon of Mura at the edge of the protrusion sub-area is relieved.

In some embodiments, the orthographic projection of the bezel cover layer covers orthographic projections of all the preset lead portions. Exemplarily, the bezel cover layer covers all the preset lead portions, so that the phenomenon of Mura at the edge of the protrusion sub-area is relieved as much as possible.

In some embodiments, a camera, a telephone receiver and other devices may be generally arranged in the protrusion sub-area. In the case that all the preset lead portions are set below the bezel cover layer, if the quantity of the preset lead portions is too large, arrangement of original devices in the protrusion sub-area may be affected, so that the quantity of the preset lead portions below the bezel cover layer may be designed according to an actual product.

In the case that the bezel cover layer cannot cover all the preset lead portions, a line width of each of the preset lead portions not covered with the bezel cover layer may be reduced, so that the reflection area of the metal at the edge of the protrusion sub-area may be reduced as much as possible.

Figure 5:
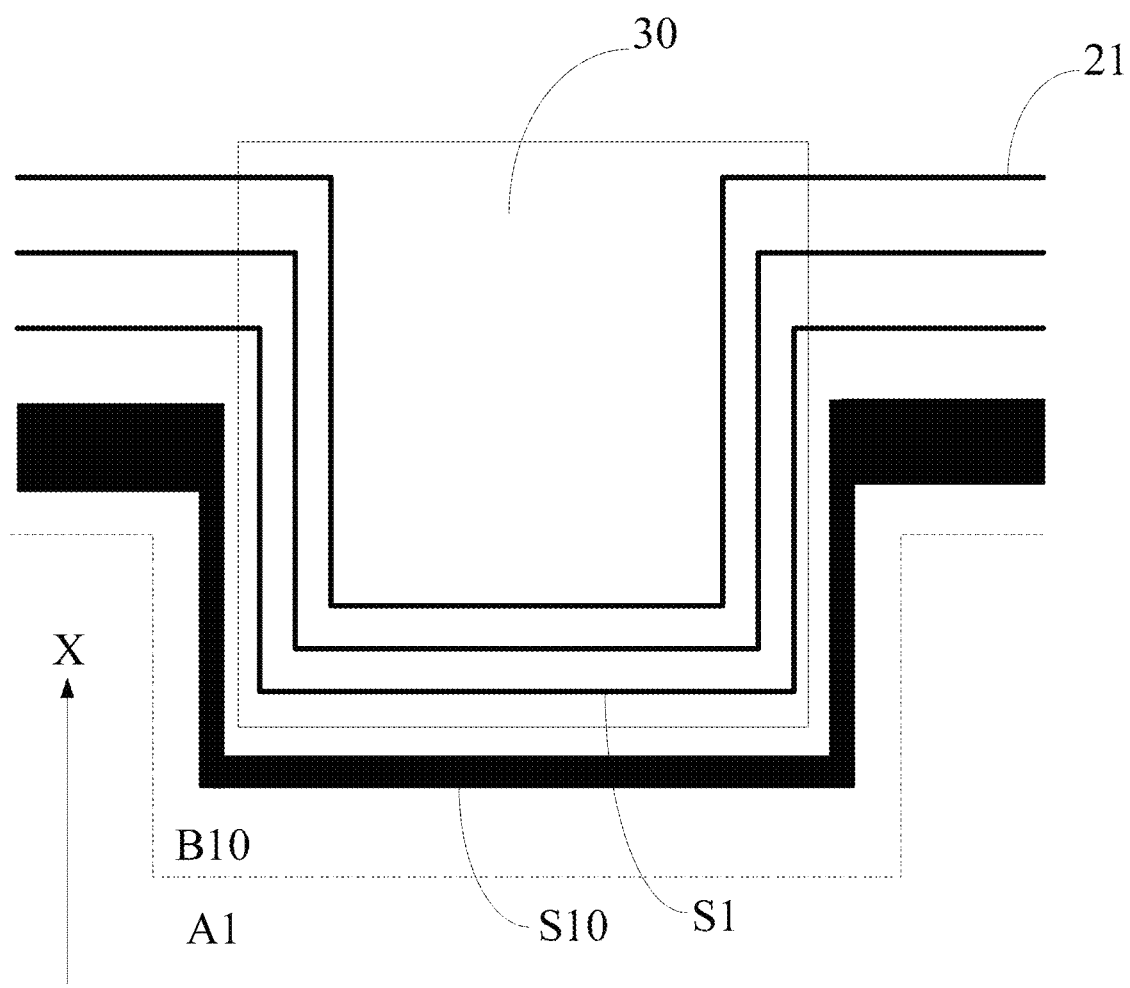
FIG. 5 shows an example second partial structure of a touch display screen according to embodiments of the disclosure.

Exemplarily, as shown in FIG. 5, in the touch display screen provided by the embodiments of the disclosure, the quantity of the plurality of preset lead portions S1 is N, and the N preset lead portions S1 are arranged in sequence in a direction X from the display area A1 to the protrusion sub-area B10.

Among the N preset lead portions S1, the orthographic projection of the bezel cover layer 30 on the display panel covers orthographic projections of x preset lead portions S1 on the display panel, where x is an integer larger than or equal to 1 but smaller than N. FIG. 5 makes illustration by taking N=4 and x=3 for example.

The (N-x) preset lead portions S1 with orthographic projections on the display panel not covered by the orthographic projection of the bezel cover layer 30 on the display panel are first preset lead portions S10. That is, the first preset lead portions S10 are the preset lead portions S1 not covered with the bezel cover layer 30. A wire width of each of the first preset lead portions S10 is smaller than a wire width of the other portion, except the first preset lead portion S10, of the lead 21 which the first preset lead portion S10 belongs to. That is, by reducing the wire width of the first preset lead portions S10 not covered with the bezel cover layer 30 at the edge in the protrusion sub-area, the area of the leads at the edge of the protrusion sub-area is reduced, and thus the phenomenon of Mura at the edge of the protrusion sub-area is reduced. In some embodiments, only the widths of the preset lead portions S1 in the leads are reduced, a wire width of the other portions of the leads 21 is not changed, and thus the influence on resistance of the leads 21 may be reduced as much as possible.

It can be understood that the wire width of each of the first preset lead portions S10 is smaller than the wire width of the other portion, except the first preset lead portion S10, of the lead 21 which the first preset lead portion S10 belongs to. Exemplarily, taking one lead for example, as shown in FIG. 5, the wire width of the first preset lead portion S10 of the lead 21 is reduced, wire widths of the other portions of the lead 21 are larger than the wire width of the first preset lead portion S10.

In some embodiments, the disclosure does not limit the wire width of each first preset lead portion, and the wire width of the first preset lead portion may be reduced as much as possible in a range of meeting the requirement for the resistance of the leads.

Exemplarily, in some embodiments, a wire width of each touch lead is usually 30 μm, a width of the first preset lead portion of the touch lead may be set to be smaller than or equal to 20 μm; a wire width of the ground lead is usually 100 μm, a width of the first preset lead portion of the ground lead may be set to be smaller than or equal to 30 μm. Specific setting may be made according to an actual product.

In some embodiments, the wire width of each touch lead is smaller than the wire width of the ground lead, reduction of a wire width of a portion of the ground lead has smaller influence on whole resistance of the ground lead. As such, the preset lead portion of the ground lead may be arranged at one side close to the display area.

In some embodiments, the x preset lead portions with orthographic projections on the display panel covered by the orthographic projection of the bezel cover layer belong to the touch leads respectively.

Furthermore, the orthographic projection of the bezel cover layer on the display panel covers an orthographic projection of each preset lead portion belonging to the corresponding touch lead on the display panel, that is, the bezel cover layer covers the preset lead portion of each touch lead.

Figure 6:
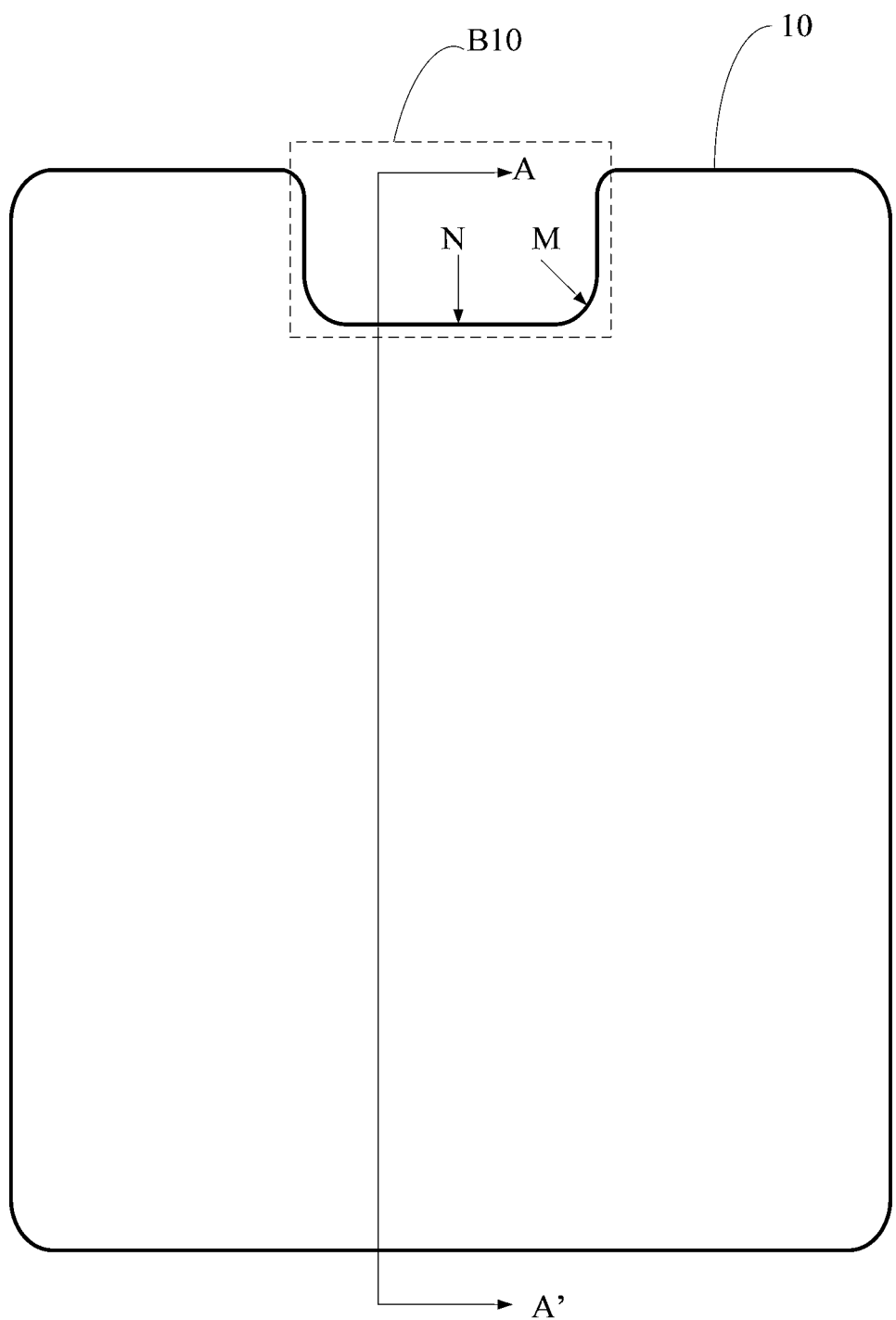
FIG. 6 shows a schematic structural diagram of a display panel in a touch display screen according to embodiments of the disclosure.
Figure 7:
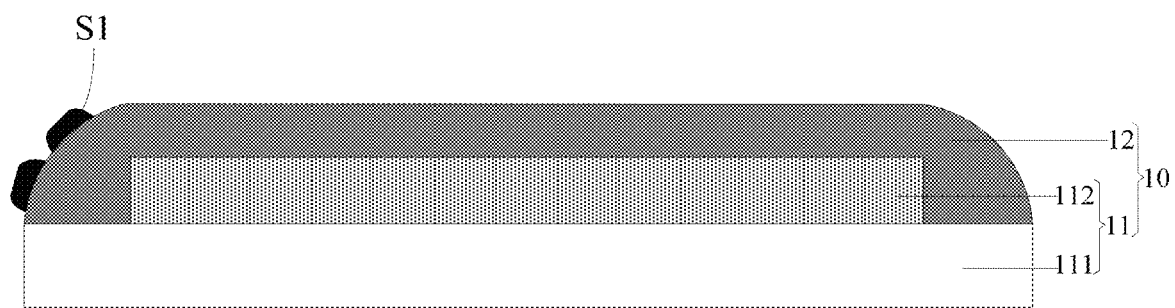
FIG. 7 shows a sectional view of a display panel in an AA' direction shown in FIG. 6.

In some embodiments, as shown in FIG. 6 and FIG. 7, in the touch display screen provided by the embodiments of the disclosure, the display panel 10 includes an OLED display substrate 11 and an encapsulation layer 12 on a light-emitting side of the OLED display substrate 11. The display panel 10 has a notch in an area corresponding to the protrusion sub-area B10, a side surface of the encapsulation layer 12 close to the protrusion sub-area B10 is a slope, and at least part of the preset lead portions S1 are disposed on the slope. The preset lead portions S1 are disposed on the slope so that a bezel width of the display panel 10 may be reduced.

Figure 8:
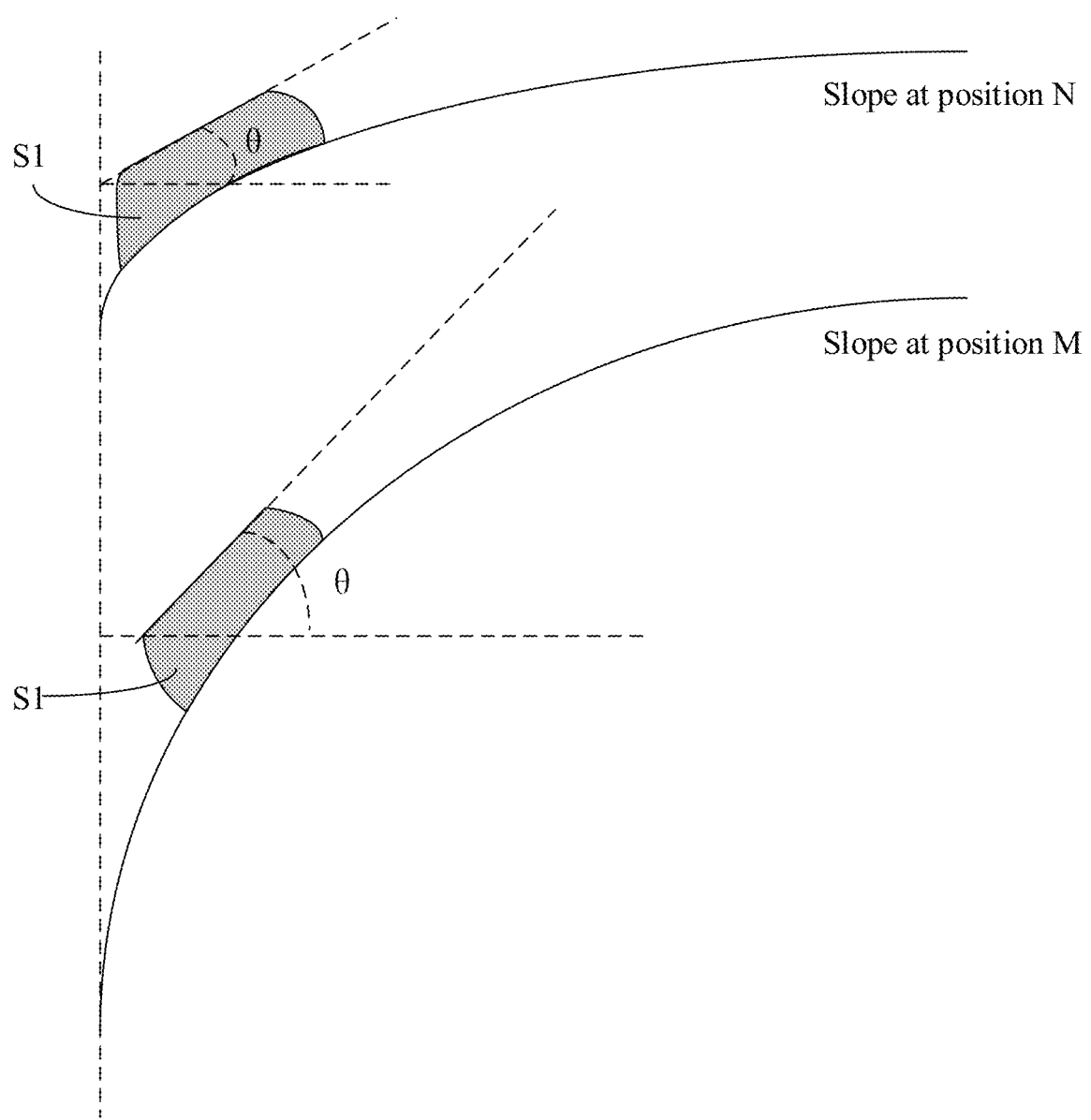
FIG. 8 shows a schematic diagram of inclination angles of upper surfaces of preset lead portions in different positions of an edge slope of an encapsulation layer in a touch display screen according to embodiments of the disclosure.

In some embodiments, as shown in FIG. 7, the OLED display substrate 11 includes a base 111 and a display function layer 112 disposed on the base 111. The display function layer 112 generally includes a pixel circuit array and an OLED array disposed on the pixel circuit array, and the encapsulation layer 12 covers the display function layer 112. The surface of the encapsulation layer 12 has a inclination angle at the edge of the protrusion sub-area, that is, a side surface of the encapsulation layer at the edge of the protrusion sub-area is a slope relative to a plane where the base is located. At least part of leads in the touch electrode structure are disposed on the slope. Due to existence of a corner of the protrusion sub-area, a slope of the encapsulation layer at the corner is steeper than slopes in the other positions of the encapsulation layer. As such, slope steep degrees of the slopes of the encapsulation layer in different positions are different, consequently, slope angles in the different positions with the leads thereon are inconsistent, thus inclination angles of metal reflection surfaces of the same lead in the different positions are different. As shown in FIG. 8, for example, the inclination angle θ of the metal reflection surface of the preset lead portion S1 on the slope in the position N is smaller than the inclination angle θ of the metal reflection surface of the preset lead portion S1 on the slope in the position M in FIG. 6, and consequently, the phenomenon of Mura at the edge of the protrusion sub-area occurs.

Figure 9:
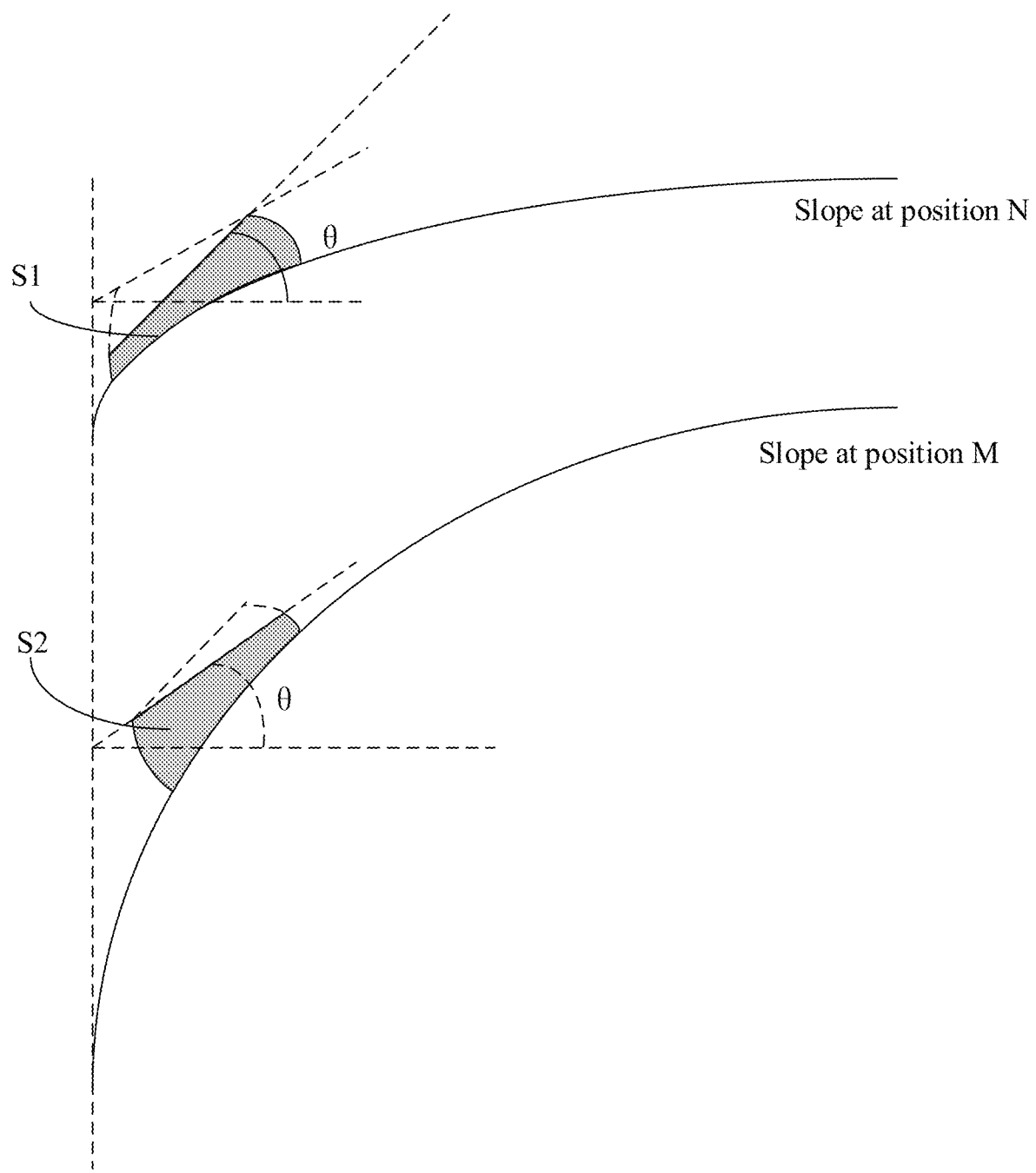
FIG. 9 shows another schematic structural diagram of preset lead portions in different positions of an edge slope of an encapsulation layer in a touch display screen according to embodiments of the disclosure.

In some embodiments, in the touch display screen provided by the embodiments of the disclosure, as for the preset lead portions disposed on the slopes and not covered by the bezel cover layer, an included angle between an upper surface of the side of each preset lead portion facing away from the display substrate and a base surface of the OLED display substrate 11 is within a preset range, so that angles of the reflection surfaces of the same preset lead portion in the different positions are consistent as much as possible. In order to guarantee that the angles of the reflection surfaces of the same preset lead portion in the different positions are consistent as much as possible, as shown in FIG. 9, a thickness of the preset lead portion S1 may be non-uniform, for example, a thickness of a part of the preset lead portion S1 close to a top of the encapsulation layer 12 in the position M may be reduced, or a thickness of a part of the preset lead portion S1 close to a bottom of the encapsulation layer 12 in the position N may be reduced.

Figure 10:
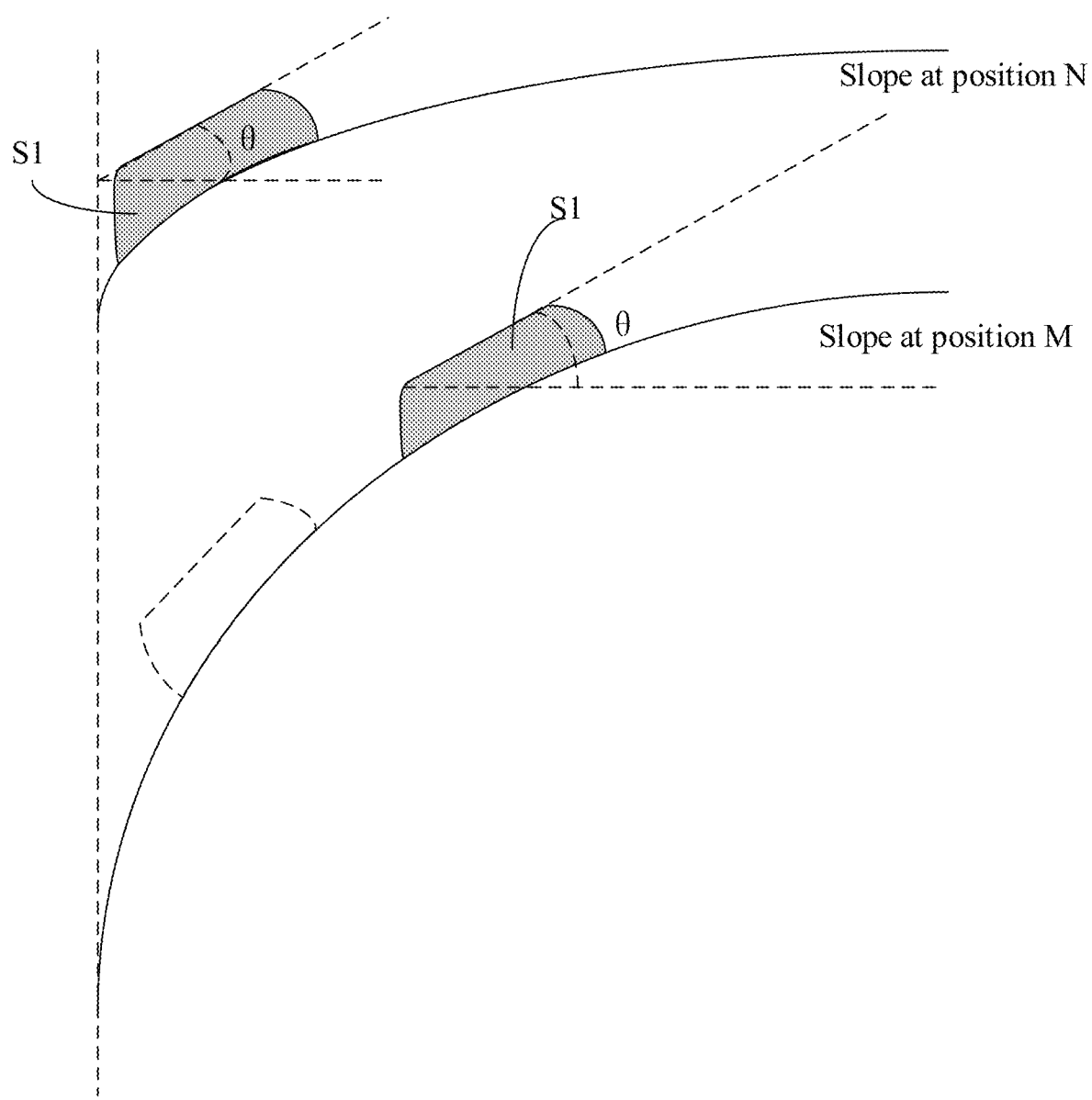
FIG. 10 shows yet another schematic diagram of positions of preset lead portions in different positions of an edge slope of an encapsulation layer in a touch display screen according to embodiments of the disclosure.

In some embodiments, in the touch display screen provided by the embodiments of the disclosure, as for the preset lead portions disposed on the slopes, along an extending direction of each preset lead portion, an included angle between a surface of the preset lead portion in direct contact with the slope and the base surface of the OLED display substrate is within a preset range, that is, slope angles of the same preset lead portion on different positions are consistent as much as possible. As shown in FIG. 10, in order to make the slope angles of the same preset lead portion on different positions consistent as much as possible, the preset lead portion S1 on the position M may be transferred from the position indicated by a dotted box (a position shown in FIG. 8) towards the top of the encapsulation layer 12, thus an included angle between a surface of the preset lead portion S1 on the position N in direct contact with the slope and the base surface of the OLED display substrate and an included angle between a surface of the preset lead portion S1 on the position M in direct contact with the slope and the base surface of the OLED display substrate each is within a preset range, that is, they are consistent as much as possible.

Based on the same inventive concept, embodiments of the disclosure provide a display apparatus, including any one display device according to embodiments of the disclosure. The display apparatus may include: a mobile phone, a tablet PC, a television, a display, a laptop, a digital photo frame, a navigator and any product or part with a display function. Implementation of the display apparatus may be referred to embodiments of the display panel, and repetitions are omitted.

According to the touch display screen and the display apparatus provided by the embodiments of the disclosure, the touch display screen includes the display panel, the touch electrode structure on the light-emitting side of the display panel and the bezel cover layer disposed on the side of the touch electrode structure facing away from the display panel. The touch display screen includes the display area and the bezel area, and the bezel area has the protrusion sub-area toward the display area. The bezel cover layer is located in the bezel area. The touch electrode structure includes the plurality of touch electrodes and the plurality of leads. The plurality of touch electrodes are located in the display area, and the plurality of leads are arranged in the bezel area along the edge of the display area. The portion of each of the plurality of leads adjacent to the protrusion sub-area is the preset lead portion. The orthographic projection of the bezel cover layer on the display panel covers an orthographic projection of at least one of the preset lead portions on the display panel. That is, at least one of the preset lead portions is covered with the bezel cover layer. As such, a reflection area of the leads is reduced, and thus the phenomenon of Mura at the edge of the protrusion sub-area is relieved.

Apparently, those skilled in the art can make various changes and modifications for the disclosure without departing from the spirit and scope of the disclosure. In this case, if these changes and modifications of the disclosure fall in the scope of the claims and their equivalents, the disclosure also intends to include these changes and modifications.

What is claimed is:

1. A touch display screen, comprising:
   a display panel;
   a touch electrode structure on a light-emitting side of the display panel; and
   a bezel cover layer disposed on a side of the touch electrode structure facing away from the display panel;
   wherein
      the touch display screen has a display area and a bezel area, and the bezel area has a protrusion sub-area toward the display area;
      the bezel cover layer is located in the bezel area;
      the touch electrode structure comprises a plurality of touch electrodes and a plurality of leads, wherein the plurality of touch electrodes are located in the display area, and the plurality of leads are arranged in the bezel area along an edge of the display area;
      a portion of each of the plurality of leads adjacent to the protrusion sub-area is a preset lead portion;
      an orthographic projection of the bezel cover layer on the display panel covers an orthographic projection of at least one of the preset lead portions on the display panel;
      a quantity of preset lead portions is N, and the N preset lead portions are arranged in sequence in a direction from the display area to the protrusion sub-area; wherein N is an integer larger than or equal to 2;
      among the N preset lead portions, the orthographic projection of the bezel cover layer on the display panel covers an orthographic projection of x preset lead portions on the display panel, wherein x is an integer larger than or equal to 1 but smaller than N; and
      each of (N-x) preset lead portions with an orthographic projection on the display panel not covered by the orthographic projection of the bezel cover layer on the display panel is a first preset lead portion, and a wire width of each first preset lead portion is smaller than a wire width of other portion, except the first preset lead portion, of a lead which the each first preset lead portion belongs to.

2. The touch display screen according to claim 1, wherein the plurality of leads comprise a ground lead and a plurality of touch leads connected with the plurality of touch electrodes;

the ground lead and at least part of the touch leads have the preset lead portions; and the x preset lead portions each belongs to a touch lead.

3. The touch display screen according to claim 2, wherein the orthographic projection of the bezel cover layer on the display panel covers each preset lead portion belonging to a touch lead.

4. The touch display screen according to claim 2, wherein a preset lead portion of the ground lead is a first preset lead portion, and a wire width of the first preset lead portion is smaller than or equal to 30 μm.

5. A display apparatus, comprising a circuit board and a touch display screen;

wherein the touch display screen comprises:

a display panel;

a touch electrode structure on a light-emitting side of the display panel; and a bezel cover layer disposed on a side of the touch electrode structure facing away from the display panel; wherein the touch display screen has a display area and a bezel area, and the bezel area has a protrusion sub-area toward the display area;

the bezel cover layer is located in the bezel area;

the touch electrode structure comprises a plurality of touch electrodes and a plurality of leads, wherein the plurality of touch electrodes are located in the display area, and the plurality of leads are arranged in the bezel area along an edge of the display area;

a portion of each of the plurality of leads adjacent to the protrusion sub-area is a preset lead portion;

an orthographic projection of the bezel cover layer on the display panel covers an orthographic projection of at least one of the preset lead portions on the display panel;

a quantity of preset lead portions is N, and the N preset lead portions are arranged in sequence in a direction from the display area to the protrusion sub-area; wherein N is an integer larger than or equal to 2;

among the N preset lead portions, the orthographic projection of the bezel cover layer on the display panel covers an orthographic projection of x preset lead portions on the display panel, wherein x is an integer larger than or equal to 1 but smaller than N; and each of (N-x) preset lead portions with an orthographic projection on the display panel not covered by the orthographic projection of the bezel cover layer on the display panel is a first preset lead portion, and a wire width of each first preset lead portion is smaller than a wire width of other portion, except the first preset lead portion, of a lead which the each first preset lead portion belongs to;

and wherein the circuit board is configured to drive the touch display screen to work.

6. The display apparatus according to claim 5, wherein the plurality of leads comprise one ground lead and a plurality of touch leads connected with the plurality of touch electrodes;

the ground lead and at least part of the touch leads have the preset lead portions; and the x preset lead portions each belongs to a touch lead.

7. The display apparatus according to claim 6, wherein the orthographic projection of the bezel cover layer on the display panel covers each preset lead portion belonging to a touch lead.

8. The display apparatus according to claim 6, wherein a preset lead portion of the ground lead is a first preset lead portion, and a wire width of the first preset lead portion is smaller than or equal to 30 μm.

9. A touch display screen, comprising:

a display panel;

a touch electrode structure on a light-emitting side of the display panel; and a bezel cover layer disposed on a side of the touch electrode structure facing away from the display panel; wherein the touch display screen has a display area and a bezel area, and the bezel area has a protrusion sub-area toward the display area;

the bezel cover layer is located in the bezel area;

the touch electrode structure comprises a plurality of touch electrodes and a plurality of leads, wherein the plurality of touch electrodes are located in the display area, and the plurality of leads are arranged in the bezel area along an edge of the display area;

a portion of each of the plurality of leads adjacent to the protrusion sub-area is a preset lead portion;

an orthographic projection of the bezel cover layer on the display panel covers an orthographic projection of at least one of the preset lead portions on the display panel;

the display panel comprises an Organic Light Emitting Diode (OLED) display substrate and an encapsulation layer disposed on a light-emitting side of the OLED display substrate;

the display panel comprises a notch in an area corresponding to the protrusion sub-area; and a side surface of the encapsulation layer close to the protrusion sub-area is a slope, and at least part of the preset lead portions are disposed on the slope.

10. The touch display screen according to claim 9, wherein for preset lead portions disposed on the slope and with orthographic projections on the display panel not covered by the orthographic projection of the bezel cover layer on the display panel, an included angle between an upper surface of a side of each of said preset lead portions facing away from the display panel and a base surface of the OLED display substrate is within a preset range.

11. The touch display screen according to claim 10, wherein for said preset lead portions disposed on the slope, along an extending direction of each of said preset lead portions, an included angle between a surface of each of said preset lead portions in direct contact with the slope and the base surface of the OLED display substrate is within a preset range.

12. A display apparatus, comprising a circuit board and the touch display screen according to claim 9;

wherein the circuit board is configured to drive the touch display screen to work.

13. The display apparatus according to claim 12, wherein for preset lead portions disposed on the slope and with orthographic projections on the display panel not covered by the orthographic projection of the bezel cover layer on the display panel, an included angle between an upper surface of a side of each of said preset lead portions facing away from the display panel and a base surface of the OLED display substrate is within a preset range.

14. The display apparatus according to claim 13, wherein for said preset lead portions disposed on the slope, along an extending direction of each of said preset lead portions, an included angle between a surface of each of said preset lead portions in direct contact with the slope and the base surface of the OLED display substrate is within a preset range.

* * * * *